(12) United States Patent
Hudetz et al.

(10) Patent No.: US 8,571,840 B2
(45) Date of Patent: Oct. 29, 2013

(54) CONSTRAINT REDUCTION FOR DYNAMIC SIMULATION

(75) Inventors: George Hudetz, Lake Oswego, OR (US); John Schlansker, Ann Arbor, MI (US); Frédéric Tachet, Saint Léger sur Roanne (FR); Estelle Pardon, Parigny (FR); Peter Legate Maxfield, Portland, OR (US)

(73) Assignee: Autodesk, Inc., San Rafael, CA (US)

( * ) Notice: Subject to any disclaimer, the term of this patent is extended or adjusted under 35 U.S.C. 154(b) by 960 days.

(21) Appl. No.: 11/761,973

(22) Filed: Jun. 12, 2007

(65) Prior Publication Data
US 2008/0243456 A1   Oct. 2, 2008

Related U.S. Application Data

(60) Provisional application No. 60/908,609, filed on Mar. 28, 2007.

(51) Int. Cl.
| G05B 19/18 | (2006.01) |
| G06F 19/00 | (2011.01) |
| G06F 17/50 | (2006.01) |
| G06G 7/48  | (2006.01) |

(52) U.S. Cl.
USPC ......... 703/7; 703/1; 700/61; 700/98; 700/245

(58) Field of Classification Search
USPC ................................ 703/7, 1; 700/61, 98, 245
See application file for complete search history.

(56) References Cited

U.S. PATENT DOCUMENTS

| 5,274,574 | A | | 12/1993 | Tsujido et al. | |
| 5,297,057 | A | * | 3/1994 | Kramer et al. | 703/7 |
| 5,424,963 | A | * | 6/1995 | Turner et al. | 703/6 |
| 5,427,531 | A | | 6/1995 | Kramer | |
| 5,835,693 | A | * | 11/1998 | Lynch et al. | 345/473 |
| 7,991,598 | B1 | * | 8/2011 | Wood | 703/7 |
| 2002/0123812 | A1 | * | 9/2002 | Jayaram et al. | 700/98 |
| 2004/0210426 | A1 | * | 10/2004 | Wood | 703/2 |
| 2007/0162164 | A1 | * | 7/2007 | Dariush | 700/61 |
| 2007/0299642 | A1 | * | 12/2007 | Kondo | 703/6 |

OTHER PUBLICATIONS

Peng Xiaobo, Chen Liping, Zhou Fanli and Zhou Ji, "Singularity Analysis of Geometric Constraint Systems", J. Comput. Sci. & Technol. May 2002.*

Cassiano Durand, and Christoph M. Hoffmann, "Variational Constraints in 3D", Computer Science Department Purdue University, 1999.*

(Continued)

*Primary Examiner* — Omar Fernandez Rivas
*Assistant Examiner* — Angel Calle
(74) *Attorney, Agent, or Firm* — Fish & Richardson P.C.

(57) ABSTRACT

Methods, program products and systems for preparing a mechanical model for a dynamic simulation. A first plurality of bodies in a mechanical model are identified including at least one grounded body and at least one free body, each of the bodies in the first plurality of bodies being related to at least one other body in the plurality of bodies by at least one constraint that removes or limits at least one degree of freedom for that body in relation to another body. The bodies in the first plurality of bodies are merged into a minimum number of rigid groups needed for a dynamic simulation where the minimum number of rigid groups includes at least one grounded group and at least one mobile group. Constraints that relate bodies within a group are removed from each of the rigid groups.

18 Claims, 13 Drawing Sheets

(56) References Cited

OTHER PUBLICATIONS

Xiaobo Peng, Kunwoo Lee, Liping Chen, "A geometric constraint solver for 3-D assembly modeling", Springer-Verlag London Limited 2005.*

Martin Otter, Hilding Elmqvist and Sven Erik Mattsson, "The New Modelica MultiBody Library", Nov. 2003.*

International Search Report for PCT Application No. PCT/US2008/57546, dated Aug. 7, 2008, 9 pages.

* cited by examiner

CONSTRAINT REDUCTION FOR DYNAMIC SIMULATION

CROSS-REFERENCE TO RELATED APPLICATIONS

This application claims priority to pending U.S. Provisional Application Ser. No. 60/908,609, entitled "Constraint Reduction for Dynamic Simulation", filed on Mar. 28, 2007, the entire contents of which are hereby incorporated by reference.

BACKGROUND

Mechanical modeling programs and other Computer Aided Design (CAD) programs allow users to interactively create and position geometric bodies relative to each other in a mechanical model. Such programs are typically good at modeling the kinematic (i.e., rigid-body) relationships between different bodies. These kinematic relationships are usually inferred by constraints applied to individual (or sets of) elements. A constraint removes or limits one or more degrees of freedom (DOF) of movement of one body (or group of bodies) in relation to another body (or group of bodies). For example, a piston head body can be constrained so that its motion is along the direction of an engine body's cylinder axis. Kinematic relationships allow designers to understand how parts fit together and move in relationship to one another.

Dynamic simulation is used to apply load and motion histories to models so that users understand the behavior (e.g., accelerations, velocities, displacements) of model bodies. Unlike kinematics, where the motion relationship between different elements is defined by inter-element constraints, dynamic simulation requires that DOF relationships be defined at the "joints" where bodies (or groups of bodies) connect.

In typical mechanical modeling programs, users are required to manually convert kinematic constraints into joints for dynamic simulation purposes. This commonly entails deleting constraints from the model and adding joints to the model. Besides being labor intensive—imagine a model such as an engine with hundreds of moving parts—this procedure allows for the creation of redundant information that can undermine a dynamic simulation. Some programs semi-automatically translate constraints into joints but still require user input to some degree and do not associate constraints with their respective joints so that a change to a constraint is not reflected in its respective joint.

Manually converting a model into one suitable for dynamic simulation can pose additional difficulties. A model can include hundreds of individual bodies, but typically only a few move relative to the others. Most are connected as rigid-body assemblies. It may be difficult for users to accurately identify groups of moving and fixed bodies. Moreover, there may be bodies in the model that translate to unconstrained DOFs in the dynamic simulation model (such as a bolt that can spin around its axis). Such unconstrained DOFs can create under-constrained situations, or spurious DOFs in a dynamic simulation.

SUMMARY

In general, one aspect of the subject matter described in this specification can be embodied in a method that includes identifying a first plurality of bodies in a mechanical model including at least one grounded body and at least one free body, each of the bodies in the first plurality of bodies being related to at least one other body in the plurality of bodies by at least one constraint that removes or limits at least one degree of freedom for that body in relation to another body. The bodies in the first plurality of bodies are merged into a minimum number of rigid groups needed for a dynamic simulation where the minimum number of rigid groups includes at least one grounded group and at least one mobile group. Constraints that relate bodies are removed within a group from each of the rigid groups. Other implementations of this aspect include corresponding systems, apparatus, and computer program products.

These and other implementations can optionally include one or more of the following features. Superfluous degrees of freedom can be removed from the first plurality. Non-moving bodies can be identified in the first plurality of bodies by determining if each body has zero degrees of freedom or has degrees of freedom that are superfluous. Redundant constraints can be removed from the first plurality of bodies. Merging can further comprise: 1) grounding a first body in the plurality of bodies; 2) solving constraints between the first body and a second moving body in the plurality of bodies; and 3) merging the first body and the second body if the second body has zero degrees of freedom or the second body's degrees of freedom are superfluous. Merging can also further comprise: 1) grounding a first body in the plurality of bodies; 2) solving constraints between the first body and second and third moving bodies in the plurality of bodies; and 3) merging the first body with the second body and the third body if the second body and the third body have zero degrees of freedom or the second and third bodies' degrees of freedom are superfluous. A plurality of lower-level constraints relating two bodies in the plurality of bodies can be replaced with a single higher-level constraint.

Particular implementations of the subject matter described in this specification can be implemented to realize one or more of the following advantages. A system is provided for reliably and automatically preparing an assembly for dynamic simulation by both simplifying the assembly and automatically addressing mathematical stability issues.

The details of one or more implementations of the invention are set forth in the accompanying drawings and the description below. Other features, aspects, and advantages of the invention will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
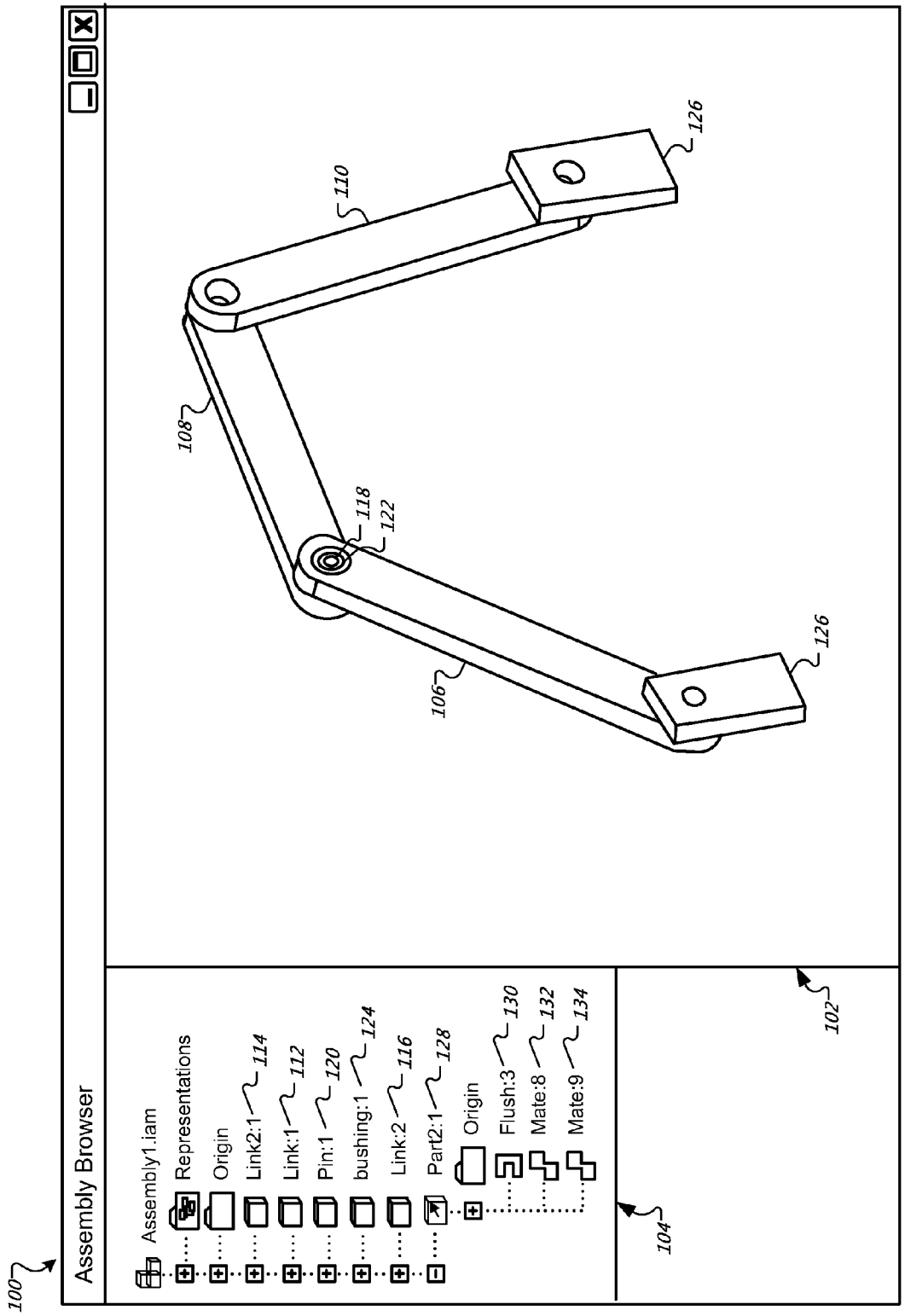
FIG. 1 illustrates a graphical user interface for an assembly browser.

FIG. 1 illustrates a graphical user interface (GUI) for an assembly browser 100. The assembly browser 100 includes functionality to allow users to create and modify bodies and constraints between bodies. A body is a part or collection of parts that move together, i.e., a rigid mass that is geometrically and kinematically connected. Bodies can have planes, axes, holes, interior surfaces and other characteristics. An assembly is a collection of bodies in a model. The assembly browser 100 presents a view 102 of an assembly, such as the linkage assembly shown in FIG. 1. The assembly browser 100 optionally includes a hierarchical representation of the assembly, such as a tree view 104, of bodies that are included in an assembly. The elements in the tree view 104 correspond to elements in the view 102.

For example, link bodies 106, 108, and 110, correspond to elements 112, 114, and 116, respectively, in the tree view 104. A pin 118 is a cylindrical body that is constrained to be in contact with the link body 106. The pin 118 corresponds to element 120 in the tree view 104. A bushing body 122 is a cylindrical body with a concentric hole that is constrained to be in contact with link 108. The bushing body corresponds to element 124 in the tree view 104. Two rectangular pieces make up a grounded body 126. Grounded bodies are bodies that are not free to move. The grounded body 126 corresponds to element 128 in the tree view 104.

The assembly browser 100 allows users to create and modify kinematic relationships between bodies. Kinematics is a branch of mechanics that describes the motions of bodies without consideration of the masses or forces that bring about the motion. Kinematics describes how bodies fit together and move in relationship to one another. In contrast, the branch of mechanics referred to as dynamics is concerned with the forces and interactions that produce or affect motion. For example, kinematics can describe a crane arm being turned and positioned to lift a weight, whereas dynamics can describe the forces required to move the crane arm and to then lift the weight.

In various implementations, the assembly browser 100 assumes that all bodies in a model are initially unconstrained. There are no limitations on movement until constraints are placed. As constraints are added the assembly becomes more and more rigid. Constraints relate bodies to one another and a body can be constrained relative to one or more other bodies in a model. A constraint removes or limits one or more DOF for a given body (or group of bodies) in relation to another body (or group of bodies). A body can have up to six open DOF: a body can be free to rotate around up to three axes (i.e., x, y, and z) and move in up to three directions (i.e., x, y, and z). As constraints are added between two bodies, the bodies have less DOF in relation to one another. Constraints can be specified using planes, axes, faces and other characteristics of bodies. For example, a piston head can be constrained so that the motion of the piston is constrained to be along the direction of an engine cylinder axis.

The tree view 104 can display constraints that have been specified for an assembly. For example, three constraints are shown underneath element 128 which are related to the grounded body 126. A flush constraint 130 has been defined to make a face of the link 106 coincident with a face of the grounded body 126. A mate constraint 132 has been defined to make the hole of the link 106 concentric with the left hole of the grounded body 126. The constraints 130 and 132 remove some but not all of the DOF of the link 106 with respect to the grounded body 126. For example, the link 106 can still rotate its hole. A second mate constraint 134 has been defined to make the hole of the link 110 concentric with the right hole of the grounded body 126.

Other constraints have been defined for other bodies, but these constraints are not currently visible in the tree view 104 because some elements are not fully expanded (the user can select a "plus" icon to expand an element). For example, an axial constraint has been defined between link 106 and link 108. The axes of the two links have been mated together.

Constraints have also been defined for the pin 118 and the bushing 122. The pin 118 is constrained to be concentric and flush with the bushing 122. The rotational DOF between the pin 118 and the bushing 122 has been left open, allowing the pin and the bushing to rotate relative to one another. The bushing 122 has been constrained to rigidly fit inside the top hole of the link 106. The pin 118 has been constrained to rigidly fit into the left hole of the link 108. As is shown, bodies, such as the pin 118, can be simultaneously constrained to more than one body.

Figure 2:
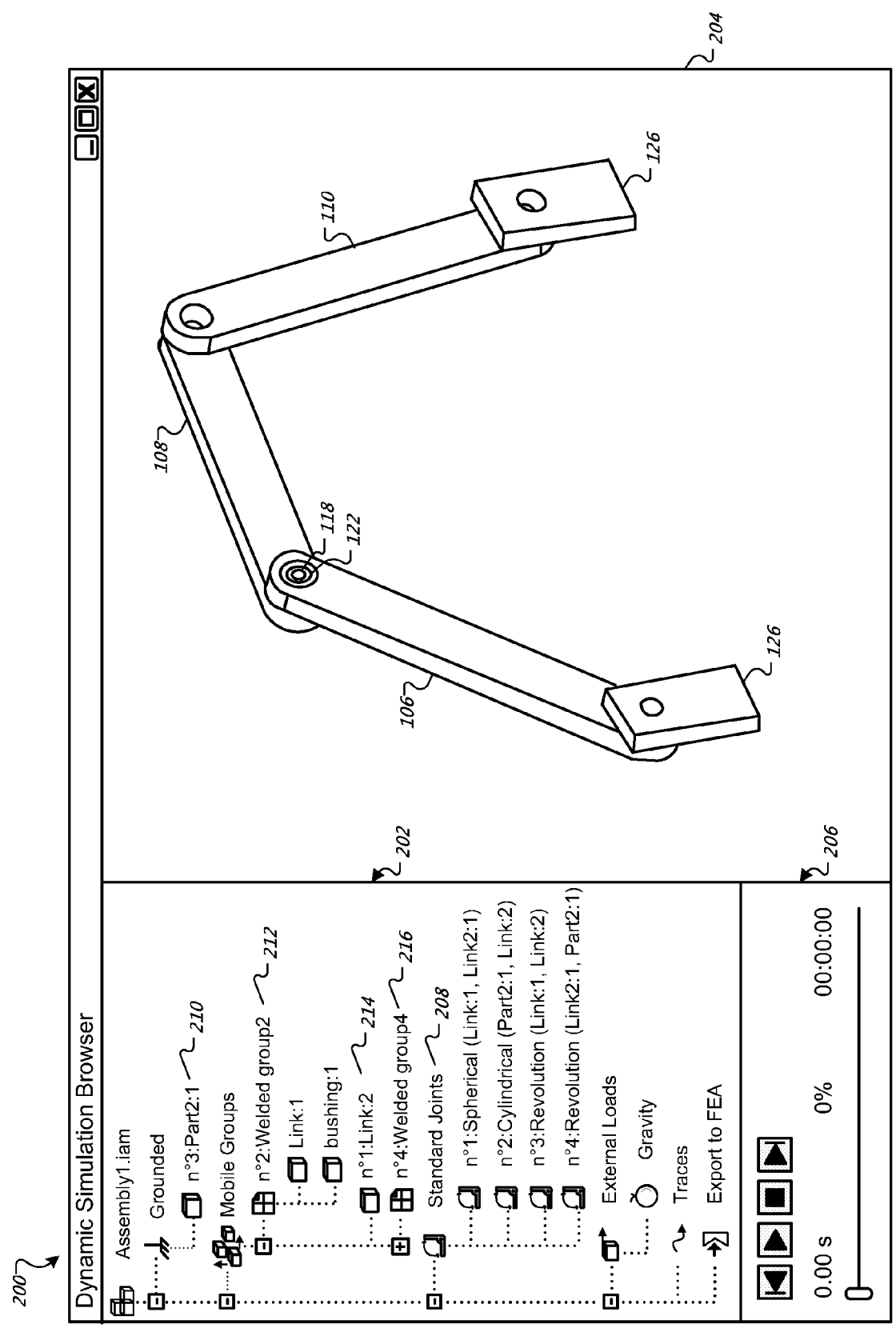
FIG. 2 illustrates a graphical user interface for a dynamic simulation browser.

FIG. 2 illustrates a GUI for a dynamic simulation browser 200. The dynamic simulation browser 200 can be associated with a dynamic simulation representation of a model. The dynamic simulation browser 200 can help users understand body behaviors such as accelerations, velocities and displacements. The dynamic simulation browser 200 can display movement simulations in which load and motion histories are applied to models. For example, a force can be applied to a body and examinations can be made regarding the effects on the rest of the assembly. Users can control a simulation (e.g., start, stop, etc.) using an interactive simulation control panel 206.

In dynamic simulation, bodies are related to one another through the use of so-called joints. Joints dictate how elements move with respect to one another. Unlike constraints, which remove DOF, joints add DOF. In various implementations, joints are implemented with constraints. In dynamic simulation, everything is initially assumed to be rigid. As joints are added, DOF are added, making the assembly more and more flexible. In various implementations, the dynamic simulation browser 200 includes a tree view 202 which can display elements in the simulation such as rigid and mobile groups of bodies and DOF between them. A graphical representation of the simulation can be shown in a view pane 204.

In various implementations, users can switch between the assembly browser 100 and the dynamic simulation browser 200 by selection of a GUI menu or by typing a key on a keyboard, for example. In various implementations, a model assembly having bodies related by constraints is automatically converted to rigid and mobile groups related by joints when users switch from the assembly browser 100 to the dynamic simulation browser 200. The conversion process is described below.

The joints that are used in the dynamic simulation browser 200 can be inferred from the constraints specified in the assembly browser 100. A software component called a constraint reduction engine (CRE) examines the kinematic constraints and automatically determines the proper dynamic relationships between groups of bodies in the assembly. The CRE converts constraints that restrict movement into those that allow movement (i.e., joints). Examples of conversions that can be performed from constraints to joints are shown in TABLE 1 below.

TABLE 1

| CONSTRAINT TYPE | JOINT TYPE |
| --- | --- |
| Mate Two Points | Ball Joint |
| Mate Point And A Line | Mate Point And Line Joint |
| Mate Line And Line | Cylindrical Joint |
| Mate Two Cylinders | Cylindrical Joint |
| Mate Two Spheres | Ball Joint |
| Mate Sphere And Cone | Ball Joint |
| Mate Two Cones | Revolute Joint |
| Mate Two Circles | Revolute Joint |
| Mate Two Planes | Planar Joint |
| Mate Point And Plane | Mate Point And Plane Joint |
| Tangent Plane Cylinder | Planar Joint |
| Translation | Translational Joint |
| Gear | Rolling Joint |
| Weldment | Weldment Joint |
| Revolute | Revolute Joint |

By way of illustration, the tree view 202 shows a "Standard Joints" element 208 that lists several joints that were created based on kinematic constraints from the assembly browser 100. Cylindrical, revolution and spherical joints were created automatically based on constraints in the assembly.

In various implementations, there is associativity between the groups and joints in the dynamic simulation browser 200 and the constraints in the assembly browser 100. As changes are made to a model in the assembly browser 100, for example, the changes are automatically taken into account in terms of defining groups and joints in the dynamic simulation browser 200.

User-specified constraints are not always optimally defined. The user may define more constraints than are necessary, resulting in redundant constraints. The CRE can, given an input of a set of bodies related by constraints, produce an equivalent minimum set of bodies and constraints that result in the same set of motions. Having a minimal set of bodies and constraints can improve the quality, performance and ease of use of a dynamic simulation. Examples of constraints that the CRE can reduce are shown below in TABLE 2.

TABLE 2

Angle Between Two Vectors
Mate Point To Spline Curve
Mate Point To Circle
Mate Point To Surface
Make Two Curves Touch
Constrain Distance Between Two Lines
Constrain Distance Between Line And Plane
Equal Distance Point Between Two Planes
Equal Distance Plane Between Two Planes
Set Distance Between Two Points
Set Distance Between A Point And A Line
Make Two Cylinders Tangent
Tangent Cylinder And Sphere
Tangent Sphere And Sphere
Tangent Plane And Cone
Tangent Cylinder And Cone
Tangent Sphere And Cone
Tangent Cone And Cone
Tangent Plane And Circle
Tangent Circle And Cylinder
Tangent Line And Cylinder
Tangent Circle And Circle
Tangent Line And Sphere TABLE 2-continued Tangent Line And Circle
Tangent Curve And Surface
Tangent Surface And Surface
Perpendicular Cur And Surface
Universal Joint
Make Tangent Across Adjacent Faces
Mate Two Profiles As part of its processing, the CRE can identify mobile and grounded groups of bodies. The grounded group contains bodies that are not free to move during a dynamic simulation: The tree view 202 lists one grounded body 210. The grounded body 210 corresponds to the grounded body 126.

Mobile groups are groups of bodies or combined rigid groups that are allowed to move with respect to the grounded groups. A rigid group is a replacement for a merged group of bodies. The tree view 202 shows three mobile groups. A first mobile group 212 is associated with the link 106 and the bushing 122. The CRE examined the constraints between these two bodies and determined that they were rigidly connected and therefore put them into a single rigid group. A second mobile group 214 is associated with the link 110. The link 110 has no other bodies rigidly constrained to it, so the CRE put this body into its own mobile group. A third mobile group 216 is associated with the link 108 and the pin 118. The CRE examined the constraints between these two bodies and determined that they were rigidly connected and therefore put them into a single rigid group.

Figure 3:
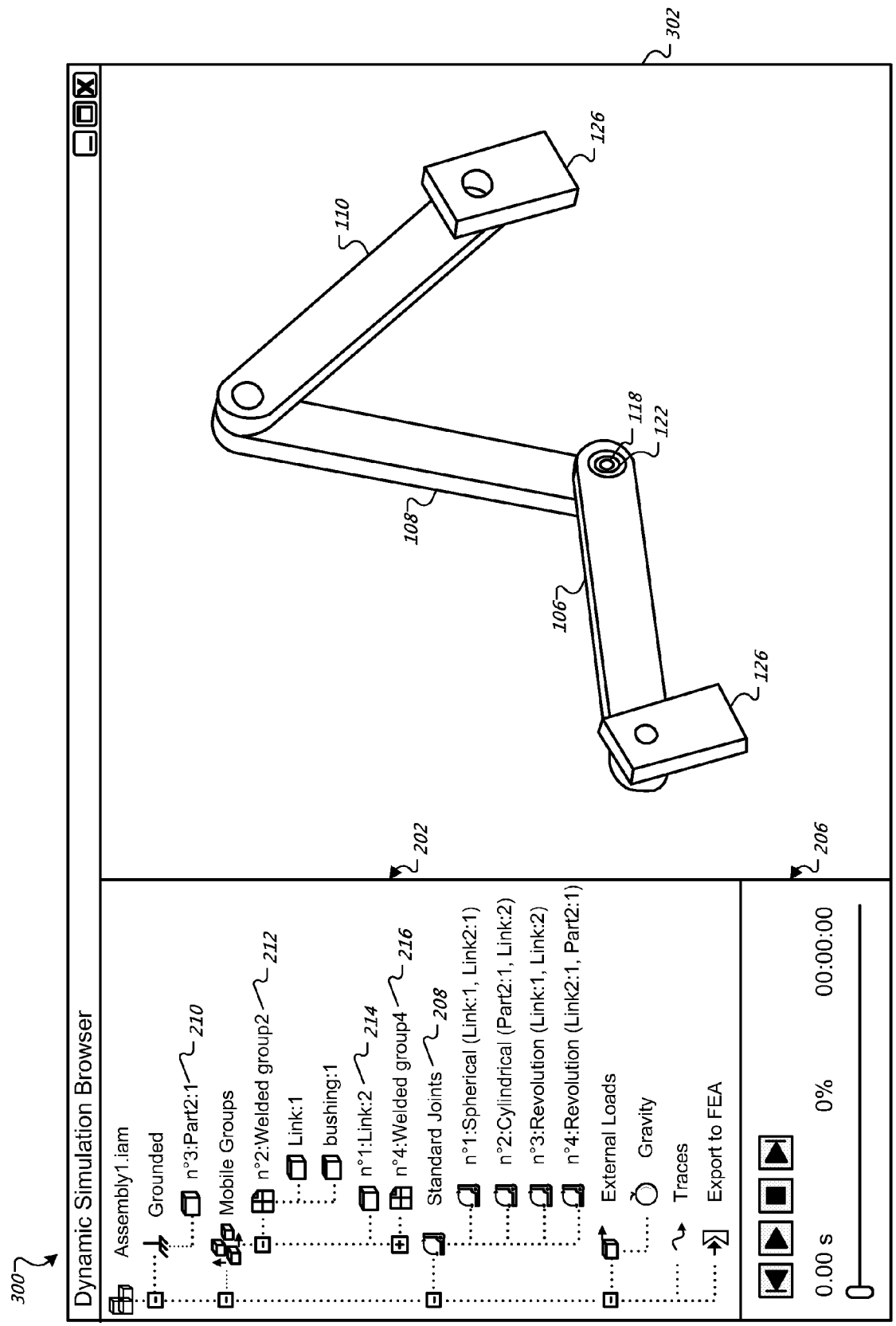
FIG. 3 illustrates a dynamic simulation browser after a motion simulation.

FIG. 3 illustrates a dynamic simulation browser 300 after a motion simulation. As mentioned above, dynamic simulation can involve the application of loads and motion histories to models. The simulation browser 300 shows an assembly after loads and motion histories have been applied to the assembly shown in the dynamic simulation browser 200. A view panel 302 shows a graphical representation of how the applied loads and motions affected the assembly. Notice how the bodies in the grounded group (i.e., 126) have not moved whereas the bodies in the mobile groups (i.e., 106, 108, 110, 118, and 122) have changed position relative to the grounded groups.

The following methods illustrated in FIGS. 4-11 can be used separately and in combination by the CRE to prepare an assembly for dynamic simulation.

Figure 4:
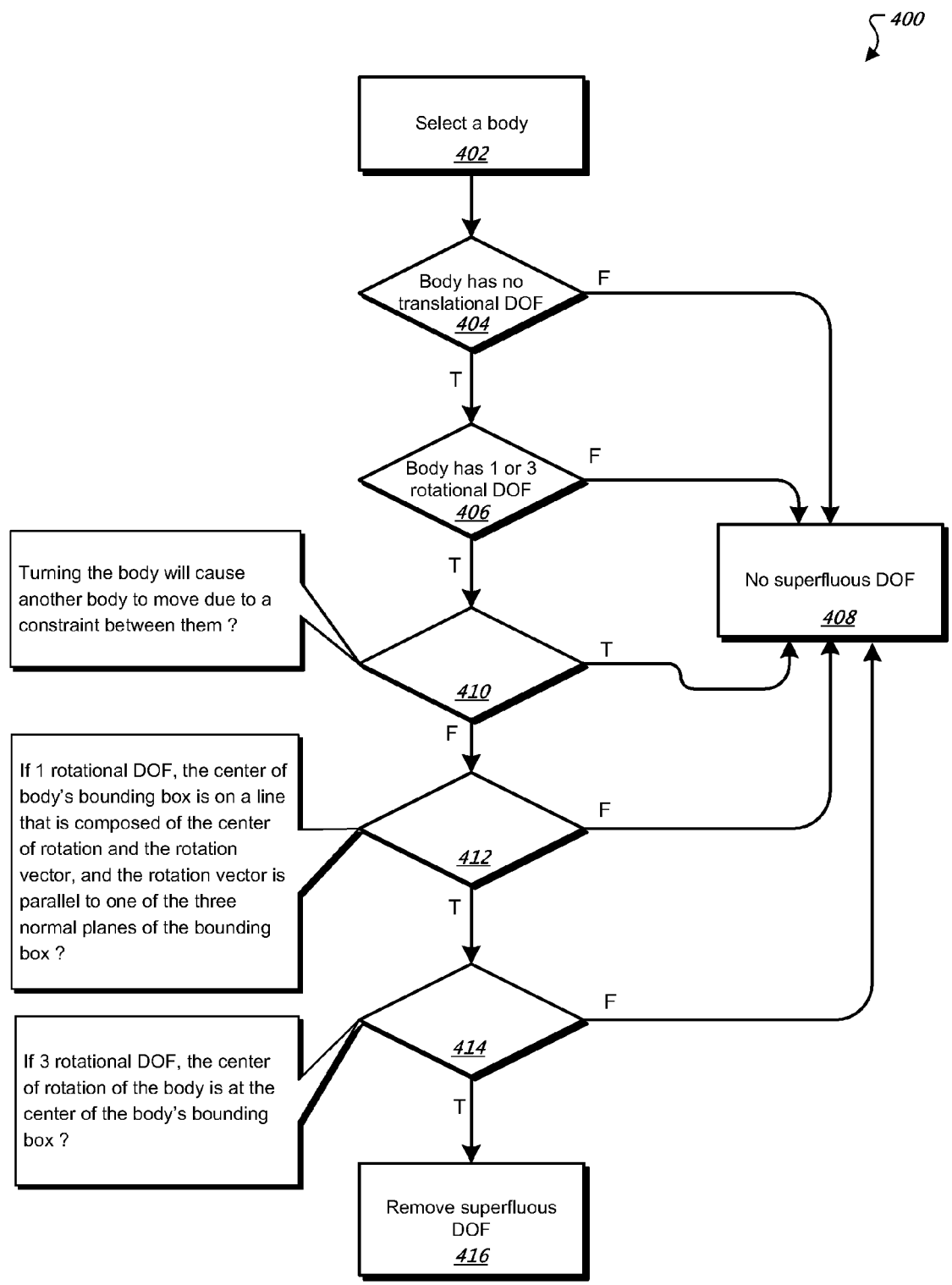
FIG. 4 is a flow chart of a method for removing superfluous degrees of freedom.

Superfluous DOF can result from under-constrained bodies in an assembly. For example, the user may not place an angular constraint on a bolt. Superfluous DOF can cause problems in dynamic simulations. FIG. 4 is a flow chart of a method 400 for removing superfluous degrees of freedom from an assembly.

The method begins by selecting a body in the assembly (step 402). For example, the link body 106 can be selected. Next, it is determined if the selected body has no translational DOF based on constraints imposed on the body (step 404). If so, it is determined if the selected body has either one or three DOF (step 406). Otherwise, the selected body is identified as having no superfluous DOF (step 408).

If the selected body has either one or three rotational DOF, it is determined whether turning the selected body will cause another body to move due to a constraint between them (step 410). If so, the selected body is identified as having no superfluous DOF (step 408). Otherwise, if the selected body has one rotational DOF, it is then determined whether the center of the selected body's bounding box is on a line that is composed of the center of rotation and the rotation vector, and that the rotation vector is parallel to one of the three normal planes of the bounding box (step 412). If not, the selected body is identified as having no superfluous DOF (step 408). If so, if the selected body has three rotational DOF, it is determined if the center of rotation of the selected body is at the center of the selected body's bounding box (step 414). If not, the selected body can be identified as having no superfluous DOF (step 408). If so, superfluous DOF are removed (step 416). For example, the CRE can remove the superfluous DOF.

Figure 5:
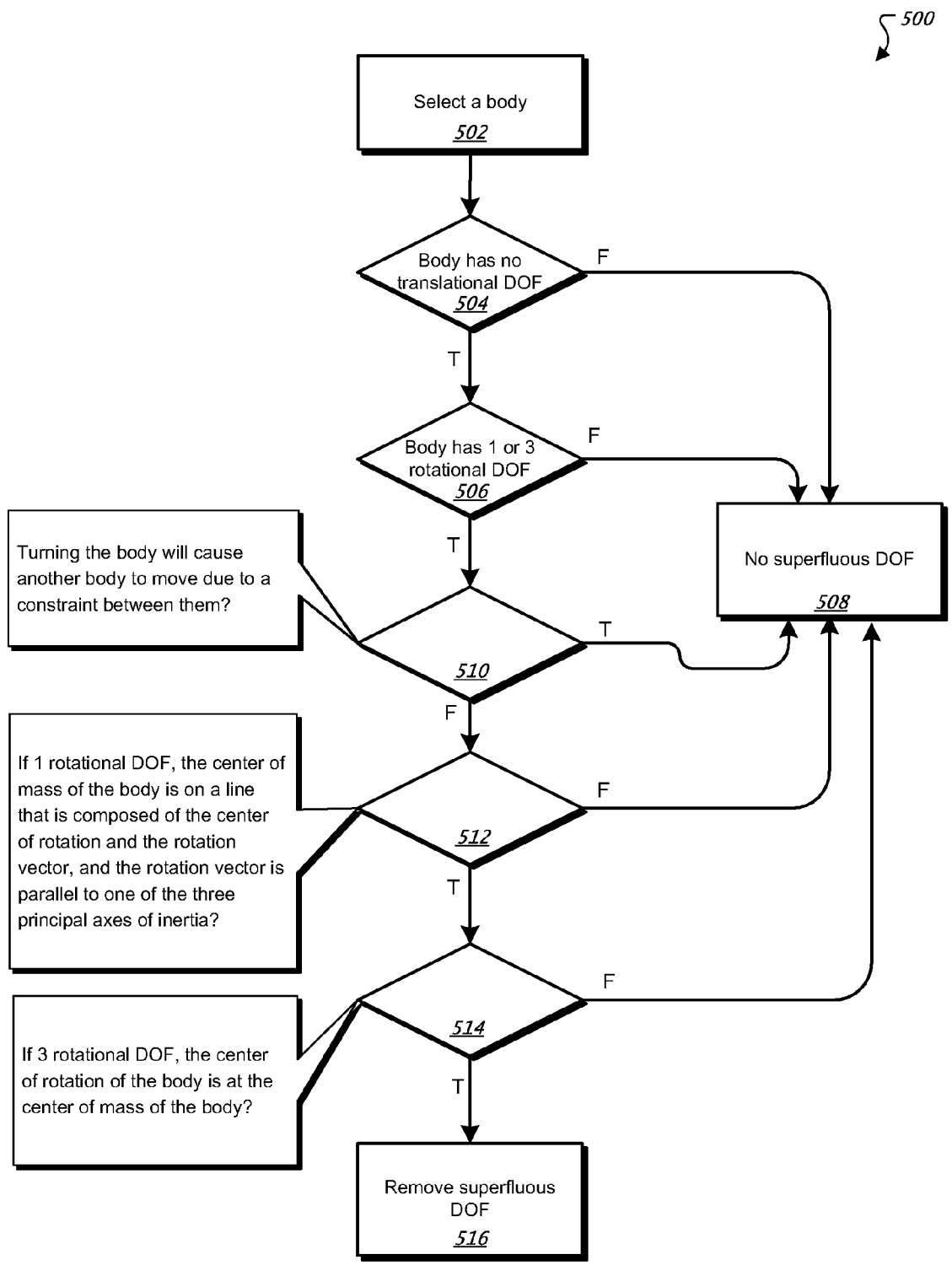
FIG. 5 is a flow chart of a method involving additional scenarios for removing superfluous degrees of freedom.

FIG. 5 is a flow chart of an additional method 500 for removing superfluous degrees of freedom. A body is selected from an assembly (step 502). For example, the link 106 can be selected. Next, it is determined whether the selected body has no translational DOF (step 504). If so, it is determined if the selected body has either one or three DOF (step 506). Otherwise, the selected body is identified as having no superfluous DOF (step 508).

If the selected body has either one or three DOF, it is determined whether turning the selected body will cause another body to move due to a constraint between them (step 510). If so, the selected body is identified as having no superfluous DOF (step 508). Otherwise, if the selected body has one rotational DOF, it is determined whether the center of mass of the selected body is on a line that is composed of the center of rotation and the rotation vector, and that the rotation vector is parallel to one of the three principal axes of inertia (step 512). If not, the selected body is identified as having no superfluous DOF (step 508). If so, if the selected body has three rotational DOF, it is determined if the center of rotation of the selected body is at the center of mass of the selected body (step 514). If not, the selected body can be identified as having no superfluous DOF (step 508). If so, superfluous DOF are removed (step 516). For example, the CRE can remove the superfluous DOF.

Figure 6:
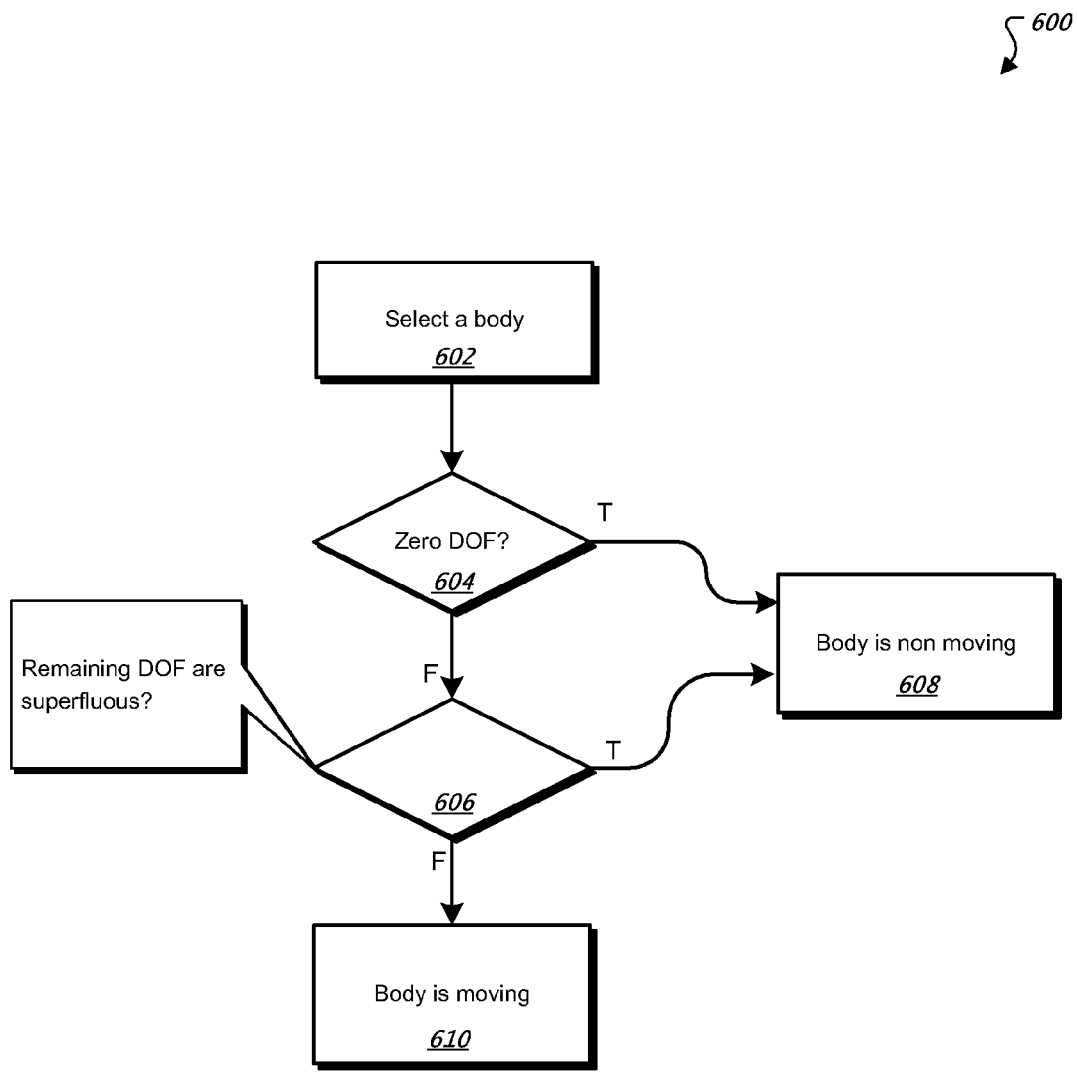
FIG. 6 is a flow chart of a method for identifying non-moving bodies.

FIG. 6 is a flow chart of a method 600 for identifying non-moving bodies. A body is selected from an assembly (step 602). For example, the link 106 can be selected. Next, it is determined whether the selected body has zero DOF (step 604). If so, the body is identified as a non-moving body and can be labeled as grounded (step 608). Otherwise, it is determined whether the remaining DOF for the body are superfluous (step 606). For example, the methods 400 and 500 can be used to detect superfluous DOF. If the remaining DOF for the body are superfluous, the body is identified as a non-moving body and can be labeled as grounded (step 608). Otherwise, the body is identified as a moving body (step 610).

Figure 7:
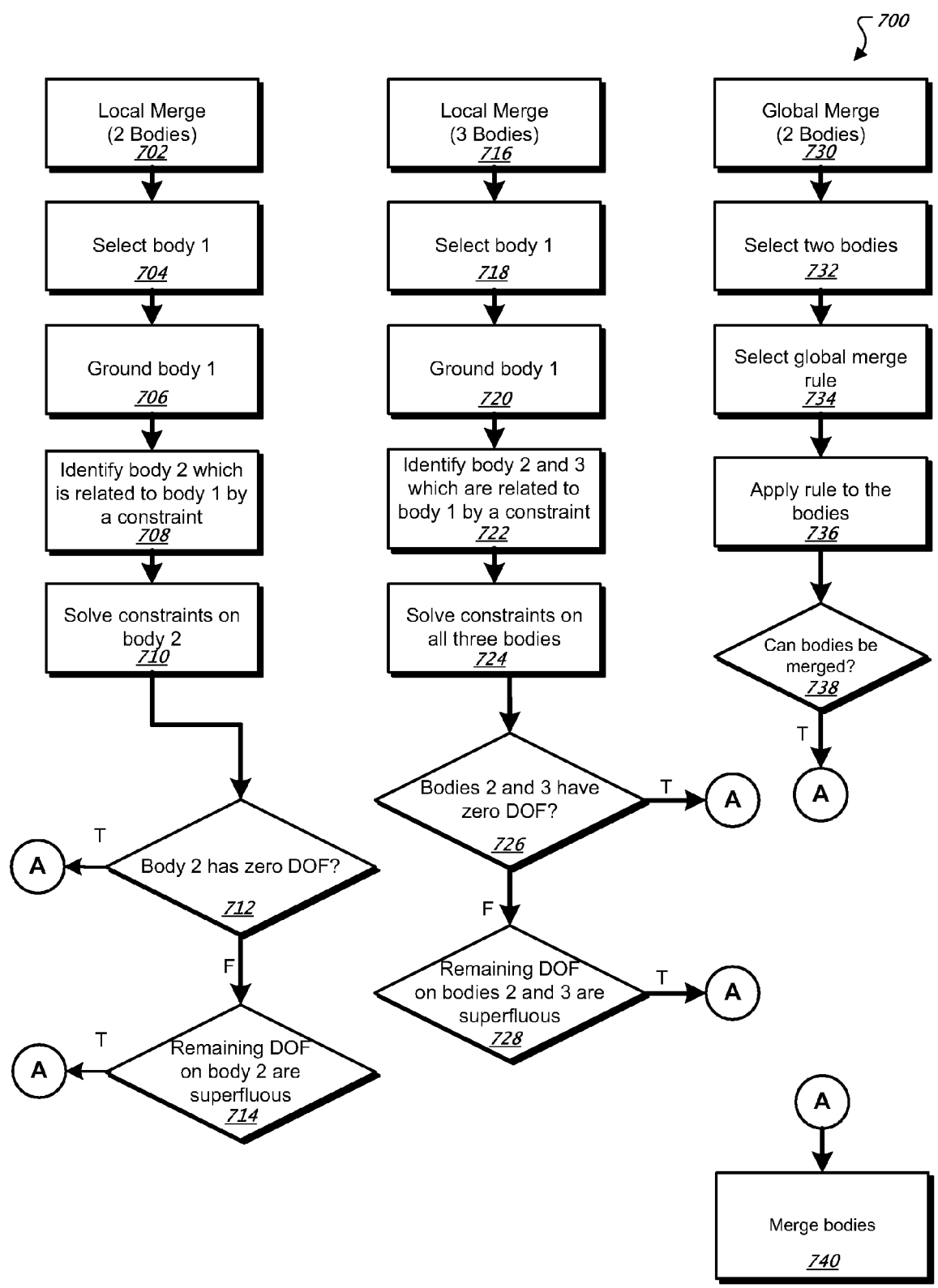
FIG. 7 is a flow chart of methods for merging bodies into rigid groups.

FIG. 7 is a flow chart of method 700 for merging bodies into rigid groups. A rigid group can be used as a replacement body for multiple merged bodies, as will be described below. Two bodies can be merged in a local merge (step 702). A first body is selected (step 704). For example, the link 106 can be selected. Next, the first body is grounded (step 706). For example, the first body can be grounded programmatically. A second body which is related to the first body by a constraint is then identified (step 708). For example, the pin 118, which is related to the link 106, can be identified. Next, constraints between the first body and the second body are solved (step 710). For example, constraints can be solved by a software system known as a variational constraint solver (VCS). The VCS can simultaneously consider the bodies and constraints related to the second body to determine how many DOF the second body has and how the second body can move without violating constraints. Next, it is determined if the second body has zero DOF (step 712). If so, the first and second bodies are merged into a rigid group (step 740). If not, it is determined if the remaining DOF on the second body are superfluous (step 714). If so, the first and second bodies are merged into a rigid group (step 740).

Three bodies can be merged in a local merge (step 716). A first body is selected (step 718). For example, the link 106 can be selected. The first body is then grounded (step 720). For example, the first body can be grounded programmatically. Second and third bodies are then identified which are related to the first body by a constraint (step 722). The second and third bodies must have one or more constraints between them. For example, the pin 118 and the grounded body 126, both related to the link 106, can be identified. Next, constraints are solved on all three bodies (step 724). For example, constraints can be solved by a VCS. Next, it is determined if the second and third bodies have zero DOF (step 726). If so, the first, second, and third bodies are merged into a rigid group (step 740). If not, it is determined if the remaining DOF of the second and third bodies are superfluous (step 728). If so, the first, second, and third bodies are merged into a rigid group (step 740).

Finally, two bodies can be merged in a global merge (step 730). Two bodies are selected (step 732). For example, the link 106 and the pin 118 can be selected. Next, a global merge rule is selected (step 734). Global merge rules take into account different scenarios for evaluating merger opportunities based on global information and mutual constraints. The selected rule is applied to the bodies (step 736). Next, it is determined if the selected bodies can be merged (step 738). If so, the selected bodies are merged into a rigid group (step 740).

Figure 8:
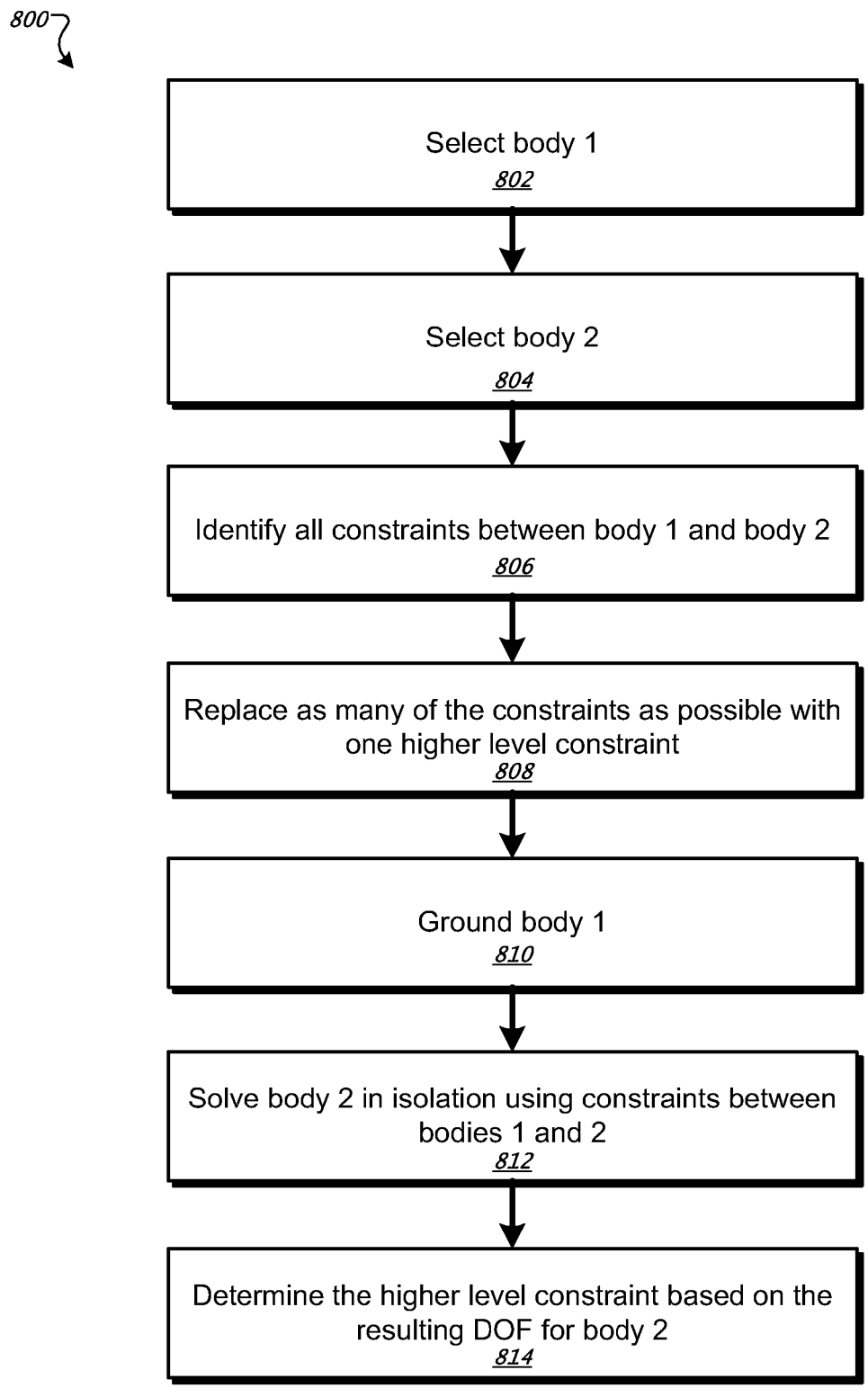
FIG. 8 is a flow chart of a method for local constraint reduction.

FIG. 8 is a flow chart of a method 800 for local constraint reduction. A first body is selected (step 802). For example, the bushing 122 can be selected. A second body is then selected (step 804). For example, the pin 118 can be selected. Next, all constraints between the first and second body are identified (step 806). For example, it can be identified that the pin 118 is constrained to be concentric and flush with the bushing 122. As many of the identified constraints as possible are then replaced with one higher-level constraint (step 808). A higher-level constraint is a constraint that is not part of another constraint composition. Next, the first body is grounded (step 810) and the second body is solved in isolation using constraints between the first and second body (step 812). For example, constraints can be solved by a VCS. Higher-level constraints are then determined based on the resulting DOF for the second body (step 814).

For example, suppose we create two constraints between body1 and body2, a mate plane/plane constraint and a mate line/line constraint. Assume that because of this, body2 has zero translational DOF and one rotational DOF with respect to body1. In this case a single constraint called a revolute joint could have been used. This is not sloppiness by the user because it's often very convenient for them to use lower-level constraints; often it is necessary in order to achieve objectives unrelated to kinematics. The CRE will find these sets of lower-level constraints and replace them with a higher-level constraint where possible.

Figure 9:
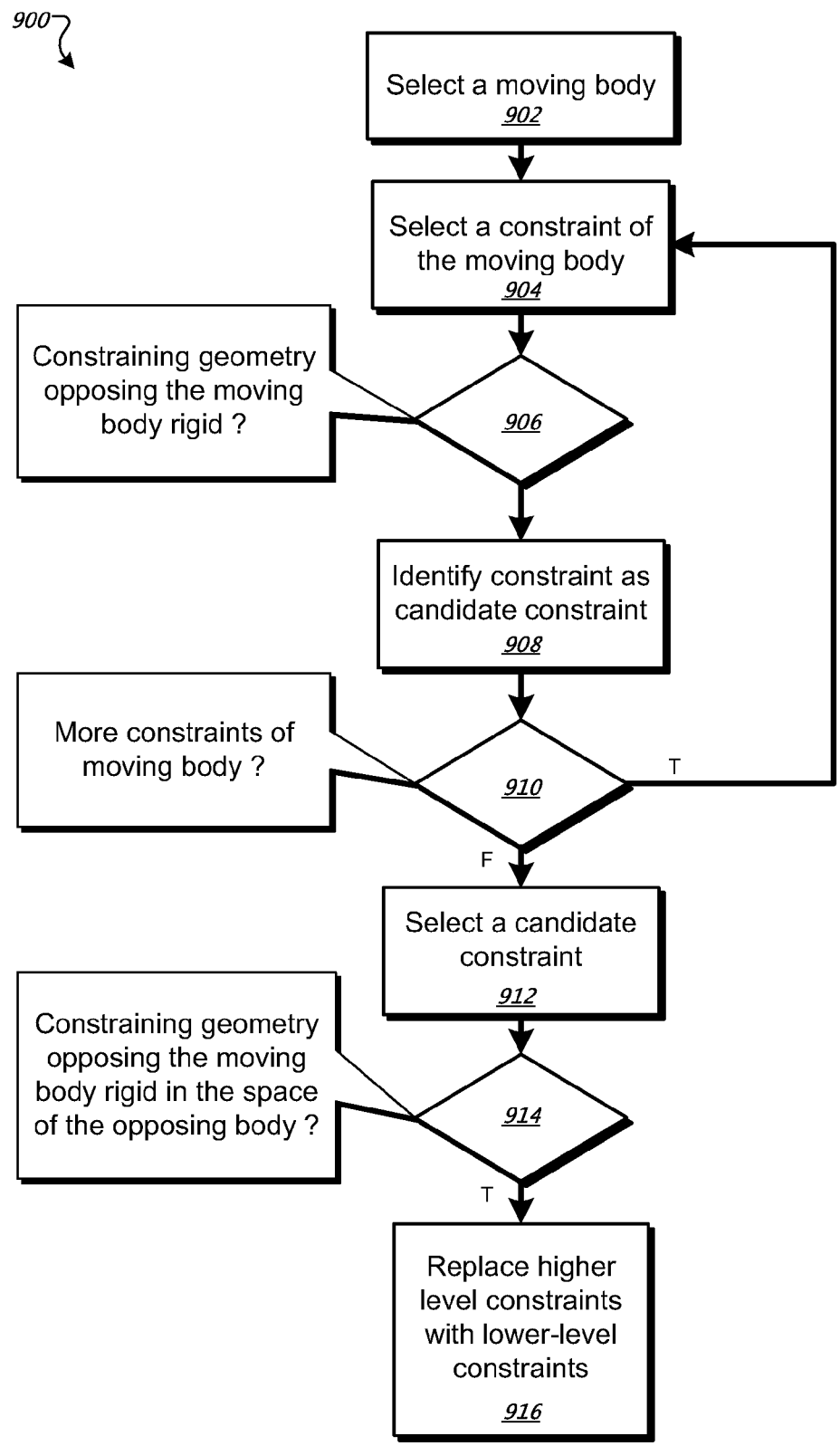
FIG. 9 is a flow chart of a method for global constraint reduction.

FIG. 9 is a flow chart of a method 900 for global constraint reduction. A moving body is selected (step 902). For example, the method 600 can be used to identify moving bodies. A constraint of the moving body is then selected (step 904). The selected constraint can be for any body that is constrained to the moving body. It is then determined whether the constraining geometry opposite the moving body is rigid (step 906). If so, the constraint is identified as a candidate constraint (step 908). For example, consider a mate plane/plane constraint between the moving body and another body. The other body can still move, but enough of its DOF have been removed such that its constraining plane is rigid.

Next, it is determined if there are constraints of the moving body that have not yet been selected (step 910). If so, an unselected constraint is selected (step 904). If not, an identified candidate constraint is selected (step 912). It is then determined whether the constraining geometry opposing the moving body is rigid in the space of the opposing body (step 914). If so, higher-level constraints are replaced with lower-level constraints (step 916). For example, suppose the moving body has a mate line/line constraint to another body that is known as "bodyB" and that the moving body has a mate plane/plane constraint to another body that is known as "bodyC", and that all three bodies have DOF. Suppose also that it has been determined that the constraining line on bodyB is rigid, and the constraining plane on bodyC is rigid. The bodyB body can be tested to see if the constraining plane to bodyC is rigid in the space of bodyB. If so, then the local constraint reduction method 800 can be used on the moving body and bodyB using both constraints to find the post-solve DOF of bodyB. The bodyC can be processed in a similar fashion.

Figure 10:
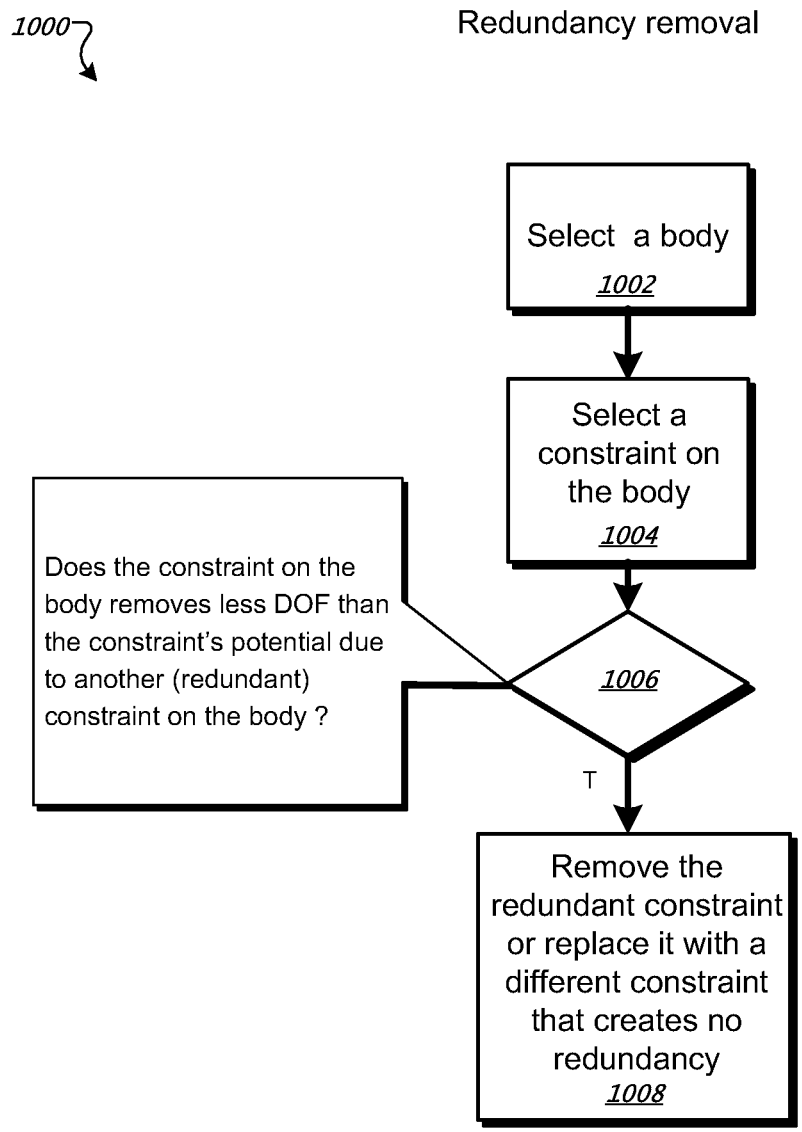
FIG. 10 is a flow chart of a method for removing constraint redundancies.

FIG. 10 is a flow chart of a method 1000 for removing redundant constraints. A body is selected (step 1002). For example, the link 106 can be selected. Next, a constraint on the selected body is selected (step 1004). Next, it is determined if the selected constraint on the selected body removes less DOF than the selected constraint's potential due to another redundant constraint on the body (step 1006). If so, redundant constraints are removed (step 1008). Redundant constraints can be removed by replacing a high-level constraint with a lower-level constraint portion that is not redundant.

For example, if a body has zero rotational DOF and one translational DOF, and a mate plane/plane constraint is used to stop the translation, a redundancy has been introduced. This is because the mate plane/plane constraint not only stops the translation, but it also creates a parallelism between the two mating planes. In this example, the planes are already guaranteed to be parallel due to other constraints (the body had zero rotational DOF before the mate plane/plane constraint was introduced). The parallelism part of the mate plane/plane constraint is not needed and is therefore redundant. The mate plane/plane constraint can be removed by replacing it with a mate point/plane constraint. The mate point/plane constraint avoids unnecessary parallelism.

Figure 11:
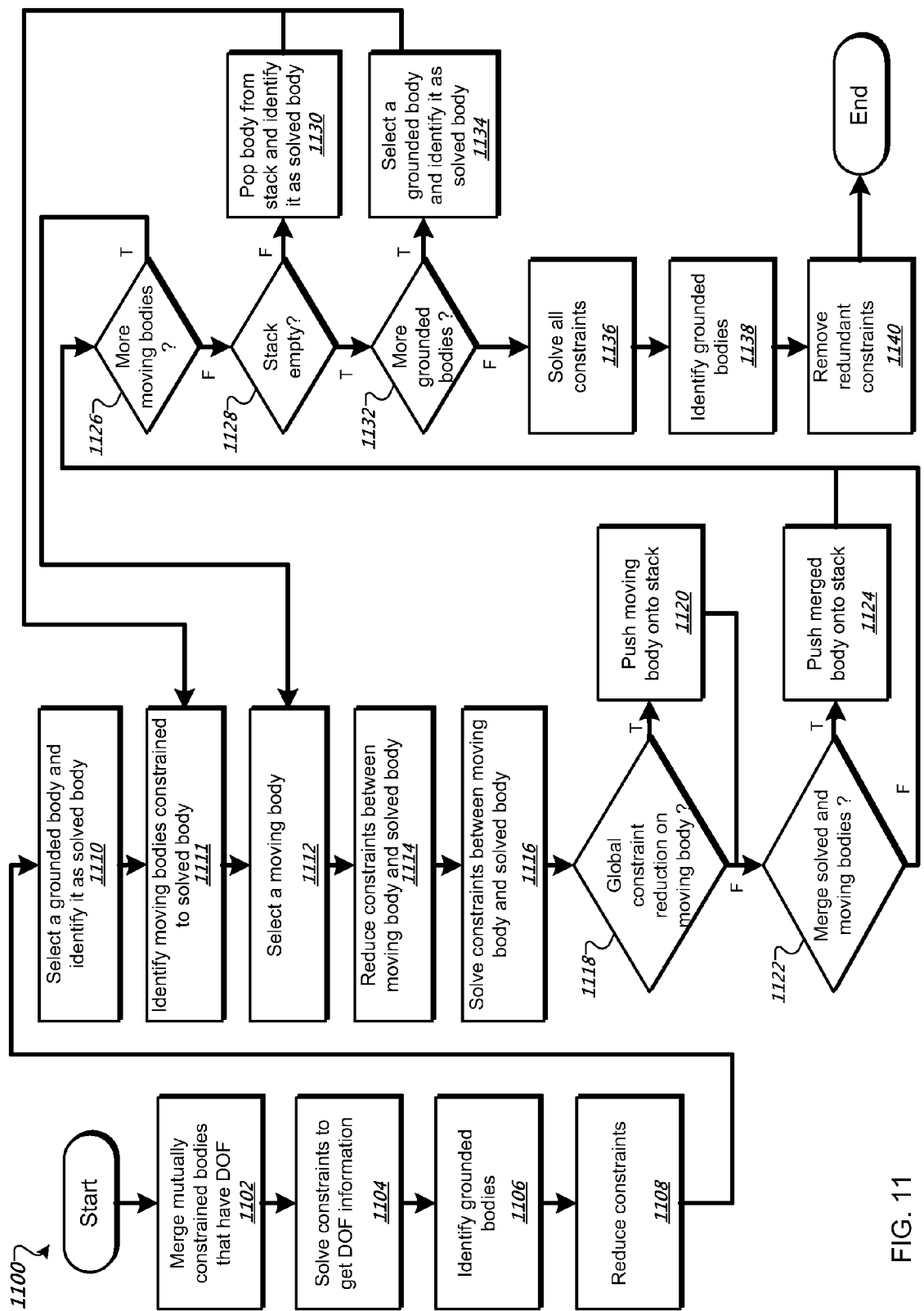
FIG. 11 is a flow chart of a method for a central constraint reduction algorithm.

FIG. 11 is a flow chart of a method 1100 for a central constraint reduction algorithm. Mutually constrained bodies that have DOF are merged (step 1102). Each set of mutually constrained bodies with DOF, two or three bodies per set, are merged into a group if possible. The method 700 discussed in FIG. 7 can be used to perform the merging. Next, constraints are solved to get DOF information (step 1104). Constraints can be solved using a VCS. Next, grounded bodies are identified (step 1106). Grounded bodies can be identified by using the method 600 discussed in FIG. 6. Constraints are then reduced (step 1108). Constraints are reduced for each pair of constrained, moving bodies. Moving bodies can be identified by using the method 600 discussed in FIG. 6. The local constraint reduction method 800 described in FIG. 8 can be used to reduce constraints, for example. Next, a grounded body is selected and identified as the current "solved body" (1110). The solved body will be used in later steps of the method 1100. The grounded body is selected from the set of grounded bodies identified in step 1106.

Moving bodies constrained to the solved body are then identified (step 1111). The moving bodies will have DOF. Moving bodies can be identified by using the method 600 discussed in FIG. 6. Next, a moving body constrained to the solved body is selected (step 1112). Other moving bodies that may be constrained to the solved body will be processed later in the method. Constraints between the moving body and solved body are then reduced (step 1114). The local constraint reduction method 800 described in FIG. 8 can be used to reduce constraints, for example. Constraints are then solved between the moving body and the solved body (step 1116). It is then determined whether constraints on the moving body can be reduced by a global constraint reduction (step 1118). For example, the global constraint reduction method 900 discussed in FIG. 9 can be used.

If constraints can be reduced by a global constraint reduction method, the moving body is pushed onto a stack (step 1120). A stack is a data structure that can hold other data structures or objects (such as the moving body) in what is referred to as a "last-in, first-out" structure. The last object pushed onto the stack is the first one removed in a remove operation. A stack data structure operates much like a stack of dinner plates in a cafeteria line.

Next, it is determined whether the solved and moving bodies can be merged (step 1122). If so, the merged body is pushed onto the stack (step 1124). The method 700 discussed in FIG. 7 can be used to determine if the merging is possible, and if so to merge the solved and moving bodies together. Next, it is determined whether there are more moving bodies (step 1126). If not all of the moving bodies identified in step 1111 have been processed then an unprocessed moving body is selected (step 1112).

If there are no more moving bodies, it is determined if the stack is empty (step 1128). If not, a body is popped from the stack and identified as the next solved body (step 1130) and moving bodies constrained to the new solved body are identified (step 1111). If the stack is empty, it is determined whether there are more grounded bodies (step 1132). (Grounded bodies had been identified in step 1106.) If there are more grounded bodies, a grounded body is selected and identified as the next solved body (step 1134) and moving bodies constrained to the new solved body are identified (step 1111).

If there are no more grounded bodies, then all constraints are solved (step 1136). There may be constraints to solve between the solved bodies identified in steps 1110 to 1134. The constraints can be solved by a VCS. Next, grounded bodies are identified (step 1138). Solved bodies which are grounded can be identified, such as by using the method 600 discussed in FIG. 6. Next, redundant constraints are removed (step 1140). Redundant constraints between the solved bodies can be removed by using the method 1000 discussed in FIG. 10.

Figure 12:
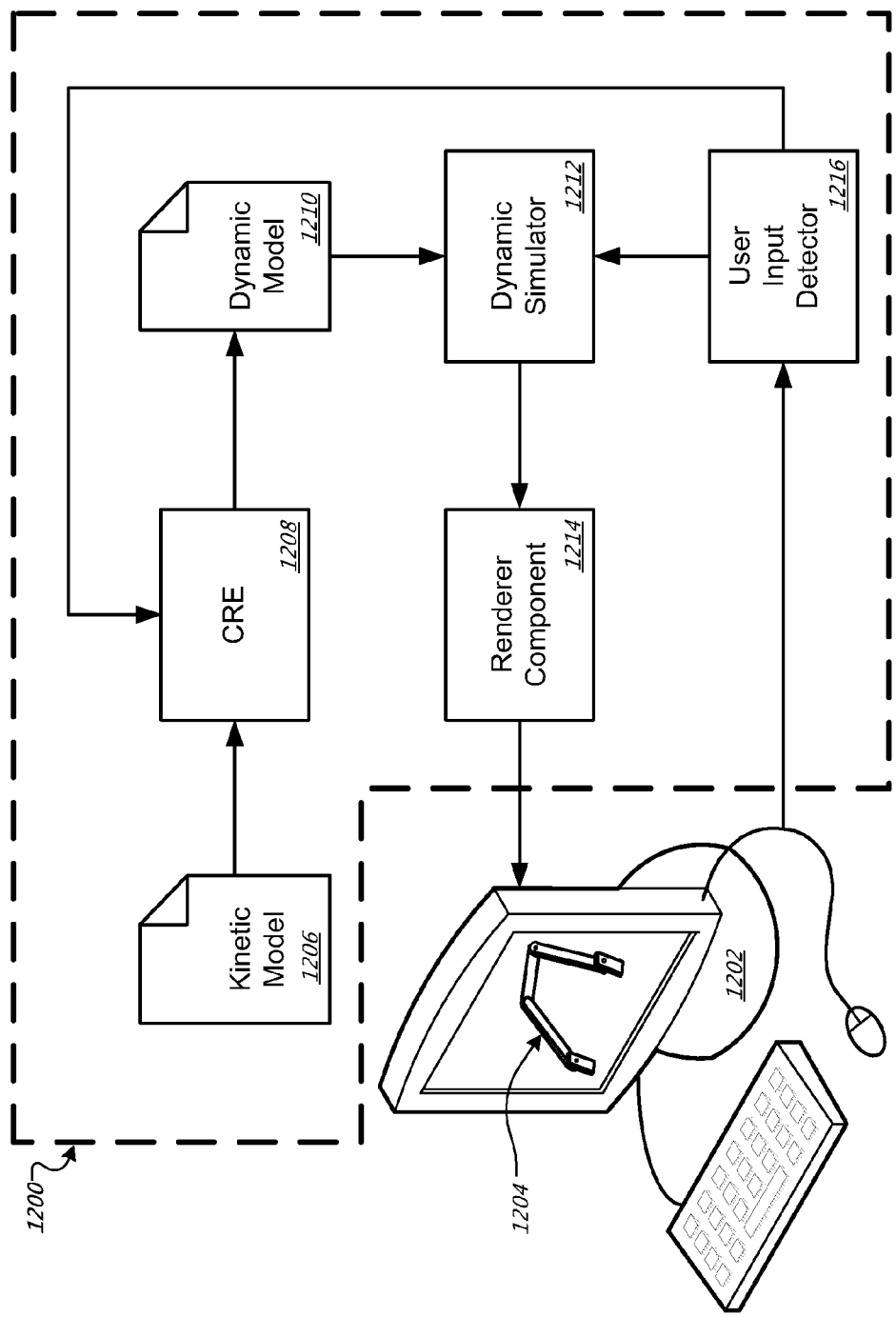
FIG. 12 illustrates a system for preparing an assembly for dynamic simulation.

FIG. 12 illustrates a system 1200 for preparing an assembly for dynamic simulation as might be implemented in a CAD system or other interactive application. Although several software components are illustrated, there may be fewer or more components in the system 1200. Moreover, the components can be distributed on one or more computing devices connected by one or more networks or other suitable communication means. A user can interact with the system 1200 through a computer 1202 or other device. For example, the computer 1202 can be a computer terminal within a local area network (LAN) or wide area network (WAN). In particular, the user may be utilizing the system 1200 to create and manipulate the graphical representation of an assembly 1204.

A kinematic model 1206 can store the kinematic information related to the assembly 1204, such as information about bodies and constraints. The CRE component 1208 can translate the kinematic information from the kinematic model 1206 into dynamic information that can be stored in a dynamic model 1210. For example, the dynamic model 1210 can store information concerning joints, grounded groups and mobile groups. A dynamic simulator component 1212 can apply loads and motion histories to the dynamic model 1210. A graphical display of the motion simulation can be displayed on the computer 1202 by a renderer component 1214.

When the user initiates or configures a motion simulation, a user input detector component 1216 receives an indication of such from the computer 1202 or a process, for example. Upon detection of the user input, the dynamic simulator component 1212 can initiate a simulation. The dynamic simulator component 1212 can communicate with the renderer component 1214 so that the current view can be updated to display the simulation.

Figure 13:
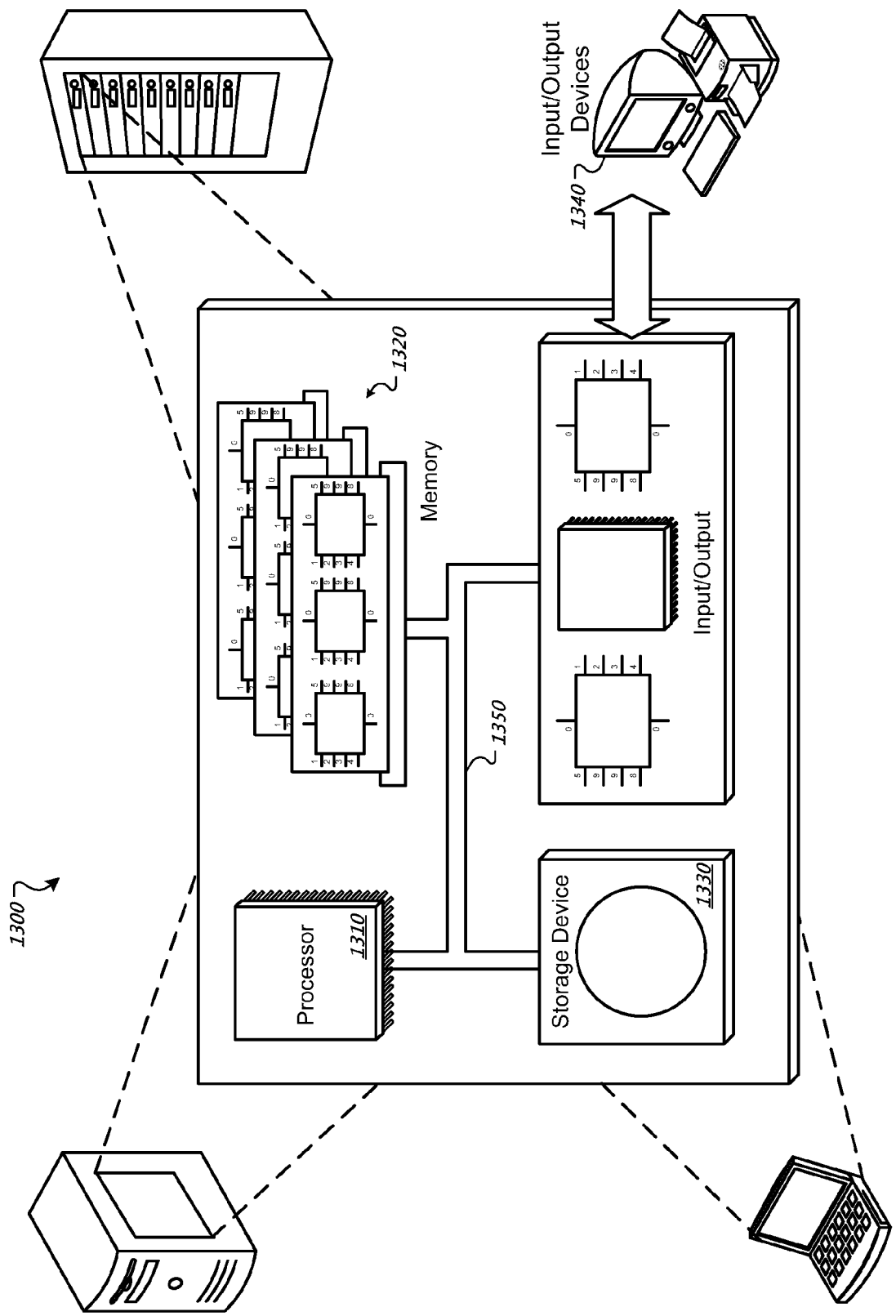
FIG. 13 is a schematic diagram of a generic computer system.

FIG. 13 is a schematic diagram of a generic computer system 1300. The system 1300 can be used for practicing operations described in association with the methods 400, 500, 600, 700, 800, 900, 1000, and 1100. The system 1300 can include a processor 1310, a memory 1320, a storage device 1330, and input/output devices 1340. Each of the components 1310, 1320, 1330, and 1340 are interconnected using a system bus 1350. The processor 1310 is capable of processing instructions for execution within the system 1300. Such executed instructions can implement one or more components of system 1200, for example. The processor 1310 can include one or more processors, can be multithreaded, and can have multiple processor cores. The processor 1310 is capable of processing instructions stored in the memory 1320 or on the storage device 1330 to display graphical information for a user interface on the input/output device 1340.

The memory 1320 is a computer readable medium such as volatile or non volatile random access memory that stores information within the system 1300. The memory 1320 could store data structures representing geometric entities and geometric constraints, for example. The storage device 1330 is capable of providing persistent storage for the system 1300. The storage device 1330 may be a floppy disk device, a hard disk device, an optical disk device, or a tape device, or other suitable persistent storage means. The input/output device 1340 provides input/output operations for the system 1300. In one implementation, the input/output device 1340 includes a keyboard and/or pointing device. In another implementation, the input/output device 1340 includes a display unit for displaying graphical user interfaces.

Implementations of the subject matter and the functional operations described in this specification can be implemented in digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a computer-readable medium for execution by, or to control the operation of, data processing apparatus. The computer-readable medium can be a machine-readable storage device, a machine-readable storage substrate, a memory device, a composition of matter effecting a machine-readable propagated signal, or a combination of one or more of them.

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal, that is generated to encode information for transmission to suitable receiver apparatus.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, implementations of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described is this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The constraint of client and server arises by virtue of computer programs running on the respective computers and having a client-server constraint to each other.

While this specification contains many specifics, these should not be construed as limitations on the scope of the invention or of what may be claimed, but rather as descriptions of features specific to particular implementations of the invention. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Thus, particular implementations of the invention have been described. Other implementations are within the scope of the following claims. For example, the actions recited in the claims can be performed in a different order and still achieve desirable results.

What is claimed is:

1. A computer-implemented method comprising:
   translating kinematic information from a kinematic model into dynamic information for a dynamic model, the dynamic information defining degree of freedom relationships at one or more joints where a plurality of bodies connect, wherein translating comprises:
      identifying a first plurality of bodies in a mechanical model including at least one grounded body and at least one free body, each of the bodies in the first plurality of bodies being related to at least one other body in the plurality of bodies by at least one constraint that removes or limits at least one degree of freedom for that body in relation to another body;
      merging the bodies in the first plurality of bodies into a minimum number of rigid groups needed for a dynamic simulation where the minimum number of rigid groups includes at least one grounded group and at least one mobile group, including:
         grounding a first body in the plurality of bodies;
         solving constraints between the first body and a second moving body in the plurality of bodies, wherein solving constraints comprises determining how many degrees of freedom the second body has and how the second body can move without violating constraints, and wherein solving constraints includes determining that the second body has zero degrees of freedom or that the second body's degrees of freedom are superfluous; and
         responsive to determining that the second body has zero degrees of freedom or that the second body's degrees of freedom are superfluous, merging the first body and the second body; and
      removing constraints that relate bodies within a group from each of the rigid groups, wherein identifying and merging and removing are performed by one or more processors; and
   performing a dynamic simulation including applying one or more loads and one or more motion histories to the dynamic model.

2. The method of claim 1, further comprising:
   removing superfluous degrees of freedom from the first plurality.

3. The method of claim 1, further comprising:
   identifying non-moving bodies in the first plurality of bodies by determining if each body has zero degrees of freedom or has degrees of freedom that are superfluous.

4. The method of claim 1, further comprising:
   removing redundant constraints from the first plurality of bodies.

5. The method of claim 1 where merging further comprises:
   solving constraints between the first body, the second body, and a third moving body in the plurality of bodies; and
   merging the first body with the second body and the third body if the second body and the third body have zero degrees of freedom or the second and third bodies' degrees of freedom are superfluous.

6. The method of claim 1, further comprising:
   replacing a plurality of lower-level constraints relating two bodies in the plurality of bodies with a single higher-level constraint, wherein the higher level constraint is not part of another constraint composition.

7. A non-transitory computer storage device encoded with a computer program, the computer program comprising instructions that when executed by data processing apparatus perform operations comprising:
   translating kinematic information from a kinematic model into dynamic information for a dynamic model, the dynamic information defining degree of freedom relationships at one or more joints where a plurality of bodies connect, wherein translating comprises;
      identifying a first plurality of bodies in a mechanical model including at least one grounded body and at least one free body, each of the bodies in the first plurality of bodies being related to at least one other body in the plurality of bodies by at least one constraint that removes or limits at least one degree of freedom for that body in relation to another body;
      merging the bodies in the first plurality of bodies into a minimum number of rigid groups needed for a dynamic simulation where the minimum number of rigid groups includes at least one grounded group and at least one mobile group, including;
grounding a first body in the plurality of bodies;
solving constraints between the first body and a second moving body in the plurality of bodies, wherein solving constraints comprises determining how many degrees of freedom the second body has and how the second body can move without violating constraints, and wherein solving constraints includes determining that the second body has zero degrees of freedom or that the second body's degrees of freedom are superfluous; and
responsive to determining that the second body has zero degrees of freedom or that the second body's degrees of freedom are superfluous, merging the first body and the second body; and
removing constraints that relate bodies within a group from each of the rigid groups; and
performing a dynamic simulation including applying one or more loads and one or more motion histories to the dynamic model.

8. The storage device of claim 7, the operations further comprising:
removing superfluous degrees of freedom from the first plurality by adding constraints to the first plurality of bodies.

9. The storage device of claim 7, the operations further comprising:
identifying non-moving bodies in the first plurality of bodies by determining if each body has zero degrees of freedom or is related by constraints that are superfluous.

10. The storage device of claim 7, the operations further comprising:
removing redundant constraints from the first plurality of bodies.

11. The storage device of claim 7 where merging further comprises:
solving constraints between the first body, the second body, and a third moving body in the plurality of bodies; and
merging the first body with the second body and the third body if the second body and the third body have zero degrees of freedom or the second and third bodies' degrees of freedom are superfluous.

12. The storage device of claim 7, the operations further comprising:
replacing a plurality of lower-level constraints relating two bodies in the plurality of bodies with a single higher-level constraint, wherein the higher level constraint is not part of another constraint composition.

13. A system comprising:
a display for presenting a target display window to a user;
one or more user interfaces configured to receive input from the user; and
data processing apparatus operable to perform operations comprising:
translating kinematic information from a kinematic model into dynamic information for a dynamic model, the dynamic information defining degree of freedom relationships at one or more joints where a plurality of bodies connect, wherein translating comprises:

identifying a first plurality of bodies in a mechanical model including at least one grounded body and at least one free body, each of the bodies in the first plurality of bodies being related to at least one other body in the plurality of bodies by at least one constraint that removes or limits at least one degree of freedom for that body in relation to another body;
merging the bodies in the first plurality of bodies into a minimum number of rigid groups needed for a dynamic simulation where the minimum number of rigid groups includes at least one grounded group and at least one mobile group, including:
grounding a first body in the plurality of bodies;
solving constraints between the first body and a second moving body in the plurality of bodies, wherein solving constraints comprises determining how many degrees of freedom the second body has and how the second body can move without violating constraints, and wherein solving constraints includes determining that the second body has zero degrees of freedom or that the second body's degrees of freedom are superfluous; and
responsive to determining that the second body has zero degrees of freedom or that the second body's degrees of freedom are superfluous, merging the first body and the second body; and
removing constraints that relate bodies within a group from each of the rigid groups; and
performing a dynamic simulation including applying one or more loads and one or more motion histories to the dynamic model.

14. The system of claim 13, further configured to perform operations comprising:
removing superfluous degrees of freedom from the first plurality by adding constraints to the first plurality of bodies.

15. The system of claim 13, further configured to perform operations comprising:
identifying non-moving bodies in the first plurality of bodies by determining if each body has zero degrees of freedom or is related by constraints that are superfluous.

16. The system of claim 13, further configured to perform operations comprising:
removing redundant constraints from the first plurality of bodies.

17. The system of claim 13 where merging further comprises:
solving constraints between the first body, the second body, and a third moving body in the plurality of bodies; and
merging the first body with the second body and the third body if the second body and the third body have zero degrees of freedom or the second and third bodies' degrees of freedom are superfluous.

18. The system of claim 13, further configured to perform operations comprising:
replacing a plurality of lower-level constraints relating two bodies in the plurality of bodies with a single higher-level constraint, wherein the higher level constraint is not part of another constraint composition.

* * * * *